United States Patent [19]
Liao et al.

[11] Patent Number: 6,153,479
[45] Date of Patent: Nov. 28, 2000

[54] METHOD OF FABRICATING SHALLOW TRENCH ISOLATION STRUCTURES

[75] Inventors: Wei-Wu Liao, Taipei Hsien; Andy Chuang; Chien-Li Kuo, both of Hsinchu Hsien, all of Taiwan

[73] Assignee: United Microelectronics Corp., Hsinchu, Taiwan

[21] Appl. No.: 09/074,959

[22] Filed: May 7, 1998

[30] Foreign Application Priority Data

Mar. 17, 1998 [TW] Taiwan .................................. 87103898

[51] Int. Cl.⁷ .......................... H01L 21/336; H01L 21/76; H01L 21/461
[52] U.S. Cl. .......................... 438/296; 438/297; 438/424; 438/431; 438/692
[58] Field of Search ..................... 438/424, 296, 438/297, 431, 692

[56] References Cited

U.S. PATENT DOCUMENTS 5,895,254  4/1999  Huang et al. .
5,940,716  8/1999  Jin et al. .
5,963,819  10/1999  Lan .

*Primary Examiner*—John F. Niebling
*Assistant Examiner*—Josetta I. Jones
*Attorney, Agent, or Firm*—Thomas, Kayden, Horstemeyer & Risley

[57] ABSTRACT

A method of fabricating shallow trench isolation structures. A substrate is provided and a masking layer and an oxide layer are formed respectively on the substrate. The masking layer, the oxide layer and the substrate are defined and an opening is formed within the substrate. A portion of masking layer and the oxide layer are removed and an insulating material is later formed to fill with the opening. The masking layer is removed and the shallow trench isolation structure of this invention is therefore achieved.

14 Claims, 3 Drawing Sheets

METHOD OF FABRICATING SHALLOW TRENCH ISOLATION STRUCTURES

CROSS-REFERENCE TO RELATED APPLICATION

This application claims the priority benefit of Taiwan application Ser. No. 87103898, filed Mar. 17, 1998, the full disclosure of which is incorporated herein by reference.

BACKGROUND OF THE INVENTION

1. Field of the Invention

The invention relates to a method of fabricating device isolation structures, and more particularly to a method of fabricating shallow trench isolation (STI) structures.

2. Description of the Related Art

Integrated circuits consist of a variety of isolation structures and different device structures and devices are separated by isolation structures, such as shallow trench isolation. Referring to FIG. 1A, a substrate 10 is provided and a pad oxide layer 11 and a nitride layer 12 are formed respectively on the substrate 10. The pad oxide layer 11 and the nitride layer 12 are defined by photolithography and an opening 13 as a trench of STI is formed within the substrate 10 by etching the substrate 10. A liner oxide layer 14 can be formed or not on the surface of the trench. Referring to FIG. 1B, an oxide layer is deposited within the trench by chemical vapor deposition (CVD) and chemical mechanical polishing (CMP) is performed to etch back the oxide layer 15. The nitride layer 12 and the pad oxide layer 11 is then removed and an oxide layer 15a as shown in FIG. 1C is therefore formed.

In the process as described above, wet etching is used to remove the pad oxide layer 11 with hydrofluoric acid solution as an etchant. During isotropic etching, the surface of the oxide layer 15a adjacent the substrate 10 is overetched due to the erosion by the hydrofluoric acid. A recess 16 is thus produced on the sidewall of the trench.

Additionally, a sacrificial oxide layer used to protect the surface of the substrate is typically formed over the surface of the substrate after forming the device isolation region. The sacrificial oxide layer is removed by hydrofluoric acid solution and overetching may still cause a recess on the oxide plug adjacent to the surface of the substrate.

When the semiconductor device is completed, the accumulation of charges occurring in the recess formed on the oxide layer adjacent to the substrate reduces the threshold voltage of the transistor and produces the abnormal sub-threshold current associated with the "kink effect". Occurrence of the kink effect impairs device and circuit performance and is thus undesirable.

SUMMARY OF THE INVENTION

It is therefore an object of the invention to remove a portion of the masking layer so that after the opening is filled with an insulating material layer and planarized, a portion of insulating material layer hangs over the trench, from the substrate surface. Additionally, the residual pad oxide layer adjacent to the insulating material layer can protect the insulating material layer adjacent to the substrate.

To achieve these objects and advantages, and in accordance with the purpose of the invention, as embodied and broadly described herein, the invention is directed towards a method of fabricating a shallow trench isolation structure. A substrate is provided and a masking layer and an oxide layer are formed respectively on the substrate. The masking layer, the oxide layer and the substrate are defined and an opening is formed within the substrate. A portion of masking layer and the oxide layer are then removed. The opening is filled within an insulating material layer, the masking layer is removed and the shallow trench isolation of this invention is completed.

It is to be understood that both the foregoing general description and the following detailed description are exemplary and explanatory only and are not restrictive of the invention, as claimed.

DESCRIPTION OF THE PREFERRED EMBODIMENTS

Figure 1A:
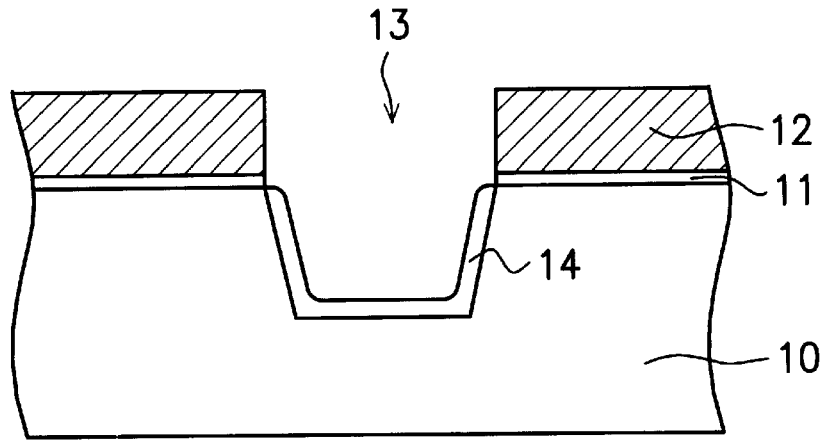
FIGS. 1A–1C schematically illustrate processing steps in the conventional formation of a shallow trench isolation structure.
Figure 1B:
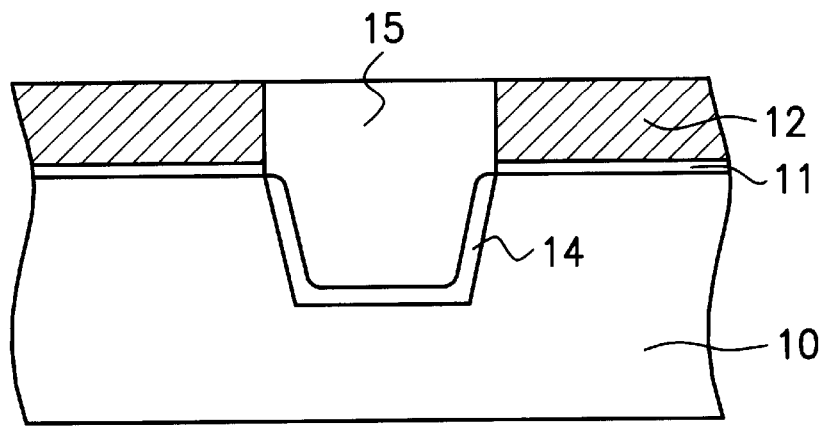
Figure 1C:
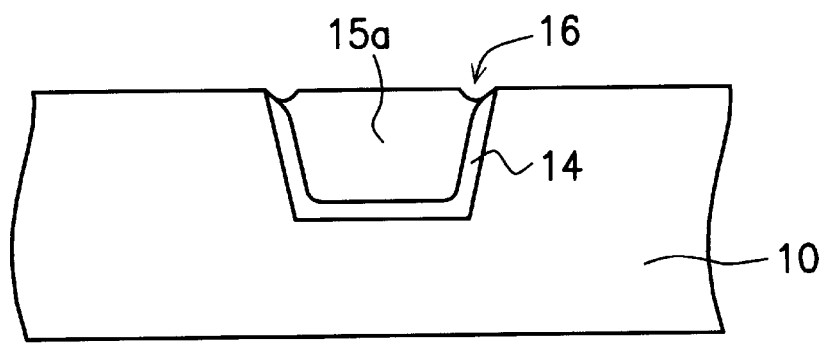
Figure 2A:
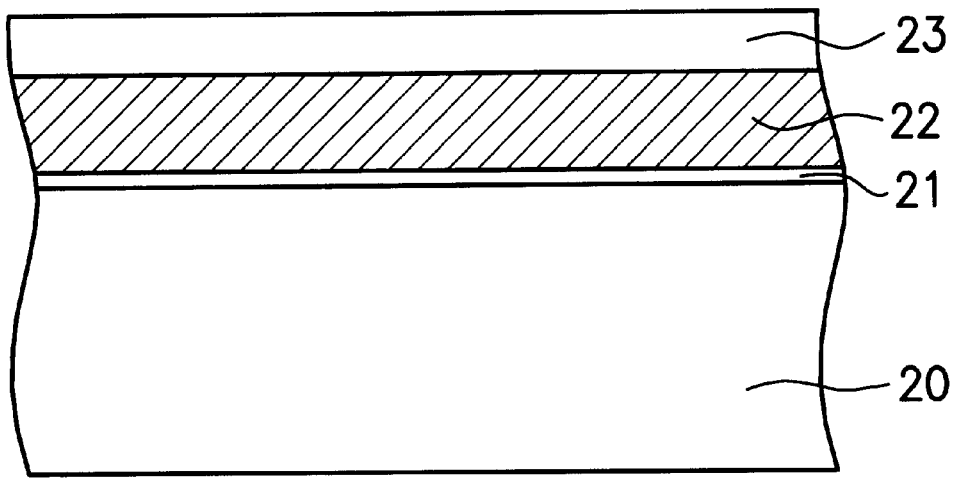
FIGS. 2A–2E schematically illustrate processing steps in the formation of shallow trench isolation in accordance with the preferred embodiments of the present invention.

Referring to FIG. 2A, a substrate 20 is provided and a pad oxide layer 21 is formed by thermal oxidation on the substrate 20. A masking layer 22 and an oxide layer 23 are then formed respectively on the pad oxide layer 21. The material of the masking layer includes silicon nitride and is formed by low pressure chemical vapor deposition (LPCVD).

Figure 2B:
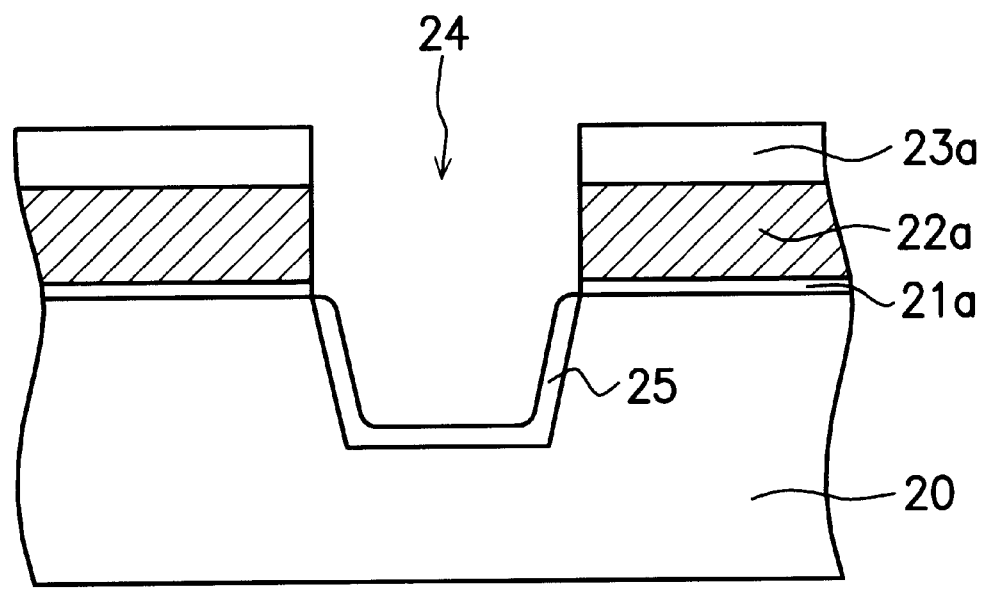

Photolithography is performed to define the oxide layer 23, the masking layer 22, the pad oxide layer 21 and the substrate 20. An opening 24 is therefore formed within the substrate 20. The oxide layer 23a, the masking layer 22a, the pad oxide layer 21a and the substrate 20 are etched by plasma with different etchants and an opening 24 is formed within the substrate 20, as shown in FIG. 2B. A liner oxide layer 25 may be formed on the surface of the opening 24 by thermal process.

Figure 2C:
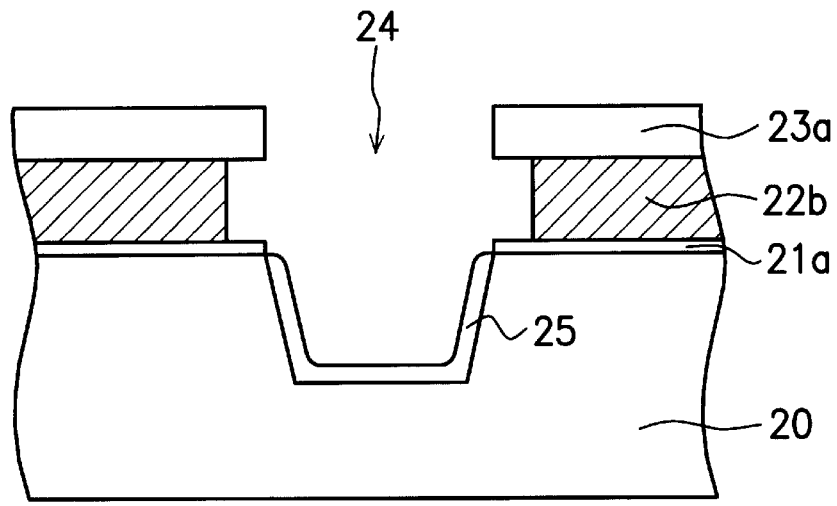

Referring to FIG. 2C, a portion of masking layer 22b is removed and the oxide layer 23a and the pad oxide layer 21a hang over the masking layer 22b.

Figure 2D:
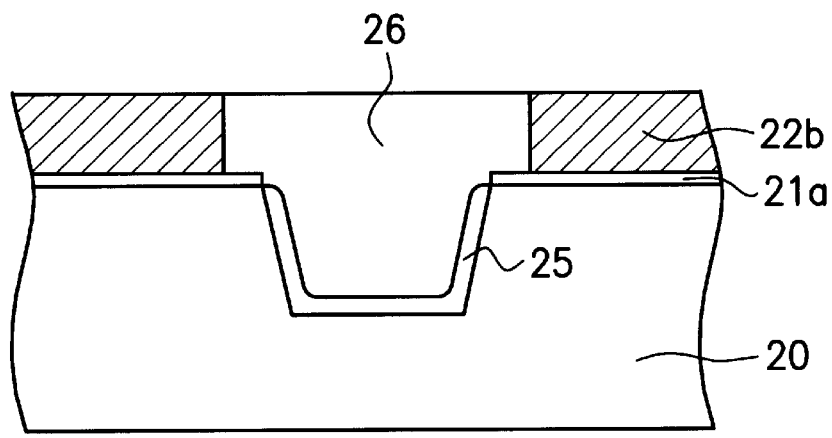

The oxide layer 23a is then removed from the surface of the masking layer 22b and a thick insulating material layer 26 is deposited on the masking layer 22b, as shown in FIG. 2D. Deposition of the insulating material layer 26 might also be achieved by high density plasma CVD (HDPCVD) with higher density and quality and without densification in the subsequent process. The insulating material layer 26 is then planarized by a 15 chemical mechanical polishing process to remove the excess insulating material layer 26 until exposing the masking layer 22a is exposed. The masking layer 22 includes a silicon nitride layer or a similar hard material used as a stop layer for CMP. The silicon nitride layer with a thickness of 1000Å and 3000Å is preferred because of its applicability and durability.

Figure 2E:
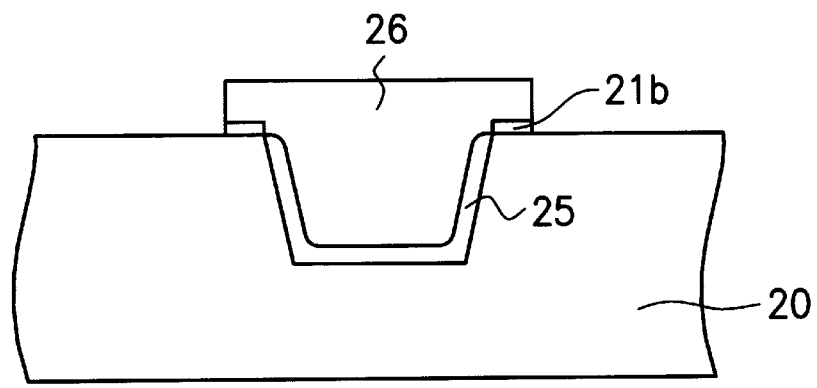

As shown in FIG. 2E, the masking layer 22b is stripped, for example, by wet etching in hot phosphoric acid at a temperature of 150–180° C., or by using a plasma etching with a suitable etchant gas, including $SF_6$, He and $O_2$. A portion of pad oxide layer 21a is then etched, for example, using wet etching in a HF solution. A portion of pad oxide layer 21b is left on the substrate 20 adjacent to the insulating material layer 26 to protect the insulating material layer 26 adjacent to the substrate 20. The shallow trench isolation in this invention is accomplished.

Other embodiment of the invention will appear to those skilled in the art from consideration of the specification and practice of the invention disclosed herein. It is intended that the specification and examples to be considered as exemplary only, with a true scope and spirit of the invention being indicated by the following claims.

What is claimed is:

1. A method of fabricating a shallow trench isolation structure, comprising:

providing a substrate;

forming a masking layer and an oxide layer on the substrate;

defining the oxide layer, the masking layer and the substrate to form an opening within the substrate;

removing a portion of the masking layer;

removing the oxide layer;

forming an insulating material layer to fill with the opening; and removing the remaining portion of the masking layer.

2. The method according to claim 1, wherein after the step of providing a substrate and before the step of forming a masking layer and an oxide layer on the substrate further comprises forming a pad oxide layer on the substrate.

3. The method according to claim 1, wherein after the step of forming an opening and before the step of removing a portion of the masking layer further comprises forming a liner oxide layer.

4. The method according to claim 1, wherein forming an insulating material layer to fill with the opening further comprises forming an insulating layer on the substrate and filling the opening; and using the masking layer as a stop layer and planarizing the insulating material layer by chemical mechanical polishing.

5. The method according to claim 1, wherein after the step of removing the masking layer further comprises removing a portion of pad oxide layer.

6. The method according to claim 1, wherein the insulating material layer is formed by APCVD.

7. The method according to claim 1, wherein the masking layer includes silicon nitride.

8. The method according to claim 1, wherein the insulating material layer includes oxide layer.

9. A method of fabricating a shallow trench isolation structure, comprising:

providing a substrate;

forming a pad oxide layer, a masking layer and an oxide layer on the substrate;

defining the masking layer, the oxide layer, the pad oxide layer and the substrate to form an opening within the substrate;

removing a portion of the masking layer;

removing the oxide layer;

forming an insulating material layer to fill the opening; and removing the remaining portion of the masking layer and a portion of pad oxide layer.

10. The method according to claim 9, wherein after the step of forming an opening and before the step of removing a portion of the masking layer further comprises forming a liner oxide layer.

11. The method according to claim 9, wherein forming an insulating material layer filling the opening further comprises forming an insulating layer on the substrate and to fill the opening; and using the masking layer as a stop layer and planarizing the insulating material layer by chemical mechanical polishing.

12. The method according to claim 9, wherein the insulating material layer is formed by APCVD.

13. The method according to claim 9, wherein the masking layer includes silicon nitride.

14. The method according to claim 9, wherein the insulating material layer includes oxide layer.

* * * * *